US012016126B2

(12) United States Patent
Chiu et al.

(10) Patent No.: US 12,016,126 B2
(45) Date of Patent: Jun. 18, 2024

(54) CARRIER TAPE SYSTEM AND COMPONENTS AND METHODS OF USE

(71) Applicant: Taiwan Semiconductor Manufacturing Co., Ltd., Hsinchu (TW)

(72) Inventors: Sung-Sheng Chiu, Hsinchu (TW); Pei-Haw Tsao, Hsinchu (TW); Tsui-Mei Chen, Hsinchu (TW); Shih-Hsing Lin, Hsinchu (TW); Li-Huan Chu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/554,621

(22) Filed: Dec. 17, 2021

(65) Prior Publication Data

US 2022/0110232 A1 Apr. 7, 2022

Related U.S. Application Data

(63) Continuation of application No. 16/291,380, filed on Mar. 4, 2019, now Pat. No. 11,240,947.

(Continued)

(51) Int. Cl.
*H05K 13/02* (2006.01)
*B65B 9/04* (2006.01)
*H01L 21/673* (2006.01)
*H01L 21/683* (2006.01)
*H05K 13/00* (2006.01)
*H05K 13/04* (2006.01)

(52) U.S. Cl.
CPC ........... *H05K 13/021* (2013.01); *B65B 9/045* (2013.01); *H01L 21/6836* (2013.01); *H05K 13/0084* (2013.01); *H05K 13/0419* (2018.08); *H01L 21/673* (2013.01)

(58) Field of Classification Search
CPC ............ H05K 13/003; H05K 13/0084; H05K 13/021; H05K 13/0417; H05K 13/0419; H01L 21/673; H01L 21/67763; H01L 21/67769; H01L 21/67772; H01L 21/6836; H01L 2221/68313; B65B 9/045; B65B 15/04; B65D 73/02
See application file for complete search history.

(56) References Cited

U.S. PATENT DOCUMENTS 3,780,856 A * 12/1973 Braverman .......... B65D 75/327
206/820
5,064,064 A * 11/1991 Itou ...................... H05K 13/003
206/719

(Continued)

FOREIGN PATENT DOCUMENTS

WO 2013/069982 A1 5/2013

*Primary Examiner* — Jeffrey T Carley
*Assistant Examiner* — Joshua D Anderson
(74) *Attorney, Agent, or Firm* — Seed IP Law Group LLP

(57) ABSTRACT

The current disclosure describes carrier tape systems, which include a cover tape having adhesion areas and non-adhesion areas which are substantially free of adhesive. Methods for supplying semiconductor devices to an apparatus, which in operation, places the semiconductor devices at desired locations are also described. Methods of forming a semiconductor device carrier system are also described.

20 Claims, 10 Drawing Sheets

Related U.S. Application Data

(60) Provisional application No. 62/691,499, filed on Jun. 28, 2018.

(56) References Cited

U.S. PATENT DOCUMENTS

| | | | |
|---|---|---|---|
| 5,960,961 A | 10/1999 | Gutentag | |
| 2006/0138016 A1 | 6/2006 | Harper | |
| 2006/0138019 A1 | 6/2006 | Yoshii et al. | |
| 2008/0087572 A1 | 4/2008 | Wihren | |
| 2012/0117925 A1 | 5/2012 | Itou | |
| 2013/0193016 A1* | 8/2013 | Sasamura | B65D 85/00 206/389 |
| 2015/0083641 A1* | 3/2015 | Wyant | H05K 13/0084 206/714 |

* cited by examiner

CARRIER TAPE SYSTEM AND COMPONENTS AND METHODS OF USE

TECHNICAL FIELD

This disclosure relates generally to a carrier tape system for semiconductor devices and components thereof, and in some embodiments, to methods of using carrier tapes.

BACKGROUND

Electronic equipment using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a wafer level chip scale packaging (WLCSP) is widely used for its low cost and relatively simple manufacturing operations. During the WLCSP operation, a number of semiconductor components are assembled on a semiconductor device.

Such devices are shipped to customers in various packaging configurations. One example of semiconductor device shipping is based on tape and reel packaging systems. In the tape and reel format, components are placed in specifically designed pockets embossed in a carrier tape body. The pockets may be sealed with a cover tape to hold components placed in the pockets. Sprocket holes may be provided along one or both margins of the carrier tape to enable the tape to be moved by automated equipment. The tape is wound onto a plastic reel for labeling and packaging before shipment.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Figure 1:
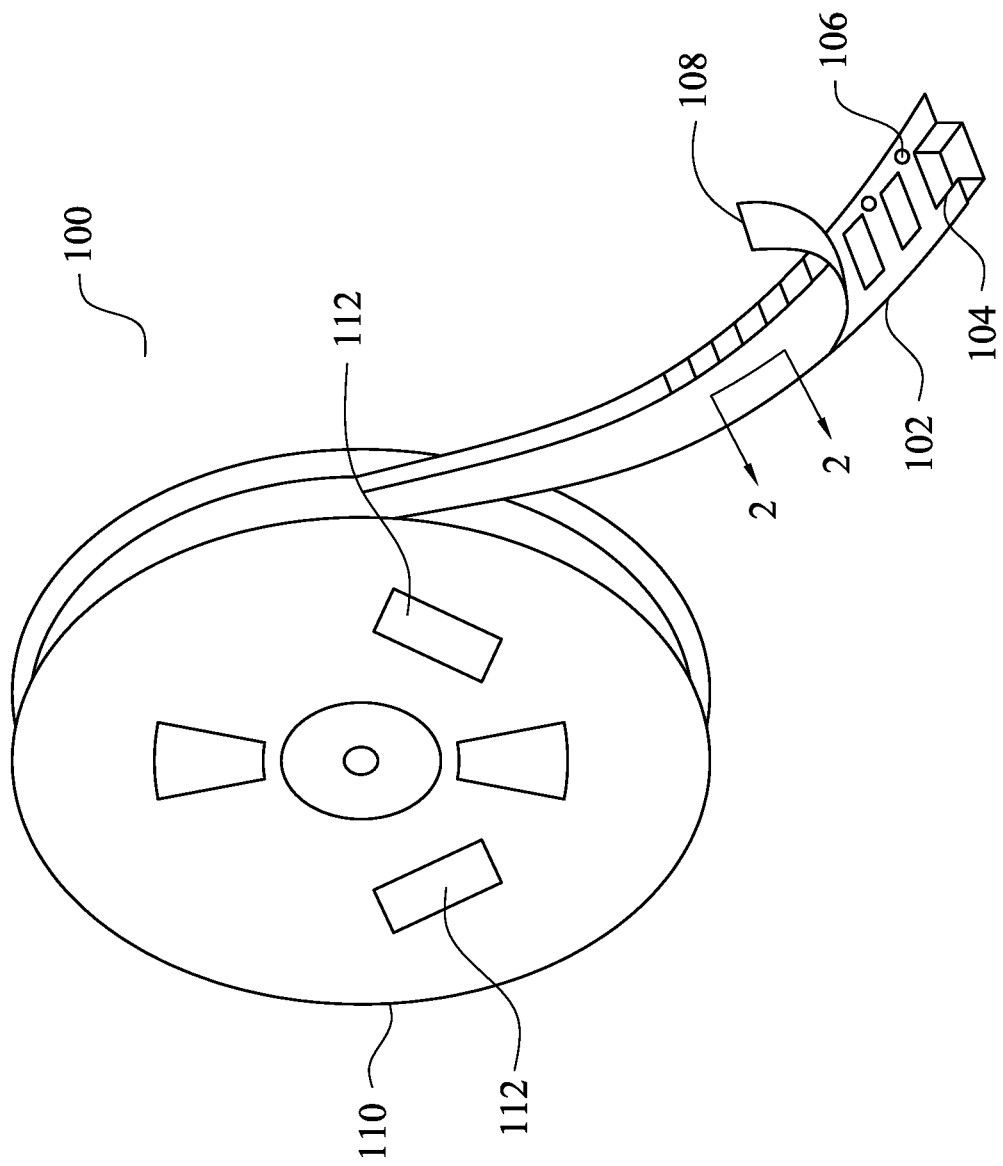
FIG. 1 illustrates an example tape and reel packaging system.

Techniques and structures in accordance with embodiments described herein are directed to novel carrier tape systems for semiconductor devices, cover tapes for use in embodiments of cover tape systems described herein and methods for supplying semiconductor devices to an apparatus, which in operation, places the semiconductor devices at desired locations. Embodiments of carrier tape systems, cover tapes and methods for supplying semiconductor devices for placement in accordance with the present disclosure experience fewer problems than conventional carrier tape systems, cover tapes and methods for supplying semiconductor devices with regard to semiconductor devices adhering to a cover tape when the cover tape is removed from a carrier tape.

Cover tape systems in accordance with embodiments described herein include a carrier tape that includes a pocket for a semiconductor device. The pocket includes an opening through which the semiconductor device is passed when the semiconductor device is placed in the pocket. The disclosed cover tape systems include a cover tape including a covering portion positioned directly over the opening when the cover tape and carrier tape are mated. The cover tape and carrier tape are mated together using an adhesive positioned between the cover tape and portions of the carrier tape around the opening. In accordance with embodiments described herein, the covering portion of the cover tape above the opening in the carrier tape is substantially free of adhesive. The absence of adhesive on the cover tape above the opening in the carrier tape results in improved performance of carrier tape systems of the present disclosure with respect to reducing occurrences of adhesion between the cover tape and a semiconductor device packaged by cover tape systems in accordance with the present disclosure.

In some embodiments, the opening has a size and a shape and the covering portion of the cover tape has a size and a shape that is substantially the same as the size and shape of the opening. In other words, in some embodiments, the size and the shape of the covering portion of the cover tape is substantially congruent with the size and the shape of the opening of the pocket. In other embodiments, the size and the shape of the covering portion of the cover tape is not substantially congruent with the size and the shape of the opening of the pocket, e.g., the covering portion of the cover tape has a shape that is substantially the same as the shape of the opening, and a size that is larger than the size of the opening of the pocket. Providing a covering portion free of adhesive above the opening in the carrier tape results in improved performance of carrier tape systems of the present disclosure with respect to reducing occurrences of adhesion between the cover tape and a semiconductor device packaged in cover tape systems in accordance with the present disclosure.

Cover tapes in accordance with embodiments described herein include a cover tape base material and an adhesive layer on the cover tape base material. In accordance with embodiments described herein, the adhesive layer includes a plurality of adhesion areas occupied by an adhesive, and a plurality of non-adhesion areas substantially free of adhesive. In some embodiments, the non-adhesion areas have a size and a shape that is substantially the same as the size and the shape of an opening of a pocket of a carrier tape with which the cover tape will be used. In other embodiments, the non-adhesion area has a shape that is substantially the same as the shape of an opening of a pocket of a carrier tape with which the cover tape is to be used, and a size that is greater than the size of an opening of a pocket of a carrier tape with which the cover tape is to be used. Providing a cover tape with non-adhesion areas free of adhesive above the opening in the carrier tape results in improved performance of cover tape systems of the present disclosure with respect to reducing occurrences of adhesion between the cover tape and a semiconductor device packaged in cover tape systems in accordance with the present disclosure.

Methods for supplying semiconductor devices to an apparatus, which in operation, places semiconductor devices at desired locations are also described. In an embodiment of such methods, an adhesion area of an adhesive layer on a cover tape is separated from a carrier tape that includes a pocket having an opening through which a semiconductor passes when the semiconductor is placed in the pocket of the carrier tape. Described embodiments of methods for supplying semiconductor devices to an apparatus, which in operation, places a semiconductor device at desired locations further include separating, from the carrier tape, a covering portion of the carrier tape which prior to the separation is directly over the opening of the pocket, the covering portion being substantially free of adhesive.

The disclosure herein provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of such features or a device in use or operation in addition to the orientation depicted in the figures. The features or device or apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques and tape and reel systems have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

FIG. 1 is a schematic illustration of a tape and reel packaging system 100. The tape and reel packaging system 100 comprises a carrier tape 102. Exemplary materials for carrier tapes include plastic materials, for example polycarbonate, polystyrene or polyethylene terephthalate. The present disclosure is not limited to carrier tapes made from polycarbonate, polystyrene, or polyethylene terephthalate. Embodiments of the present disclosure can be applied to carrier tapes made from materials other than polycarbonate, polystyrene or polyethylene terephthalate. Carrier tape 102 can exhibit varying conductive and anti-static qualities to suit different applications; however, the present disclosure is not limited to carrier tapes that exhibit conductive or anti-static qualities. Carrier tape 102 includes pockets 104 for housing a component, e.g., a semiconductor device (not shown in FIG. 1). Semiconductor devices include discrete devices, integrated circuits and packaged semiconductor devices such as wafer level chip scale packages (WLCSP); however, the present disclosure is not limited to such types of semiconductor devices. Pockets 104 may be embossed into the carrier tape 102, for example, or may be formed in other ways that do not involve embossing. Pockets 104 may be polygonal in shape, e.g., square, rectangular, pentagonal, hexagonal, etc., or they may be non-polygonal in shape, e.g., round or oval. Pockets 104 include openings through which a component is passed when the component is placed in a pocket. Sprocket holes 106 may be provided along one or both margins of a top surface of the carrier tape 102. The sprocket holes 106 enable precise detection of the pockets 104 by a pick and place unit which is an example of an apparatus for removing components from carrier tape 102 and placing the removed components at desired locations. The pockets 104 are sealed with a cover tape 108 to hold in place components placed in the pockets 104. In accordance with examples of the present disclosure, a cover tape includes an adhesive layer that includes a heat-activated adhesive (HAA) or a pressure-sensitive adhesive (PSA). Polyethylene is an example of an adhesive material that can be used as a primary component of a cover tape adhesive; however, embodiments of the present disclosure are not limited to using a cover tape adhesive having polyethylene as a primary component, cover tape adhesives containing other polymeric material as a major component can be used as a cover tape adhesive in accordance with the present disclosures. Embodiments in accordance with the present disclosure are not limited to cover tapes that utilize an HAA or PSA adhesive, e.g., embodiments of the present disclosure are applicable to cover tapes that utilize adhesives that are not HAA or PSA. In a taping process in which a cover tape 108 including an HAA is mated with a carrier tape 102, a heated sealing shoe presses the cover tape onto the edges of the carrier tape, thereby sealing the cover tape to the carrier tape. In an HAA taping process, time, heat, and pressure are controlled for achieving optimum adhesion. After cooling, if the temperature of the HAA is increased after the taping process, the HAA may soften and increase in tackiness/stickiness. In the taping process in which a cover tape 108 including a PSA is mated with a carrier tape 102, the cover tape adheres when pressure is applied. Heat is not required to activate the bond when a PSA is used. In some embodiments, the PSA remains sticky even after the cover tape has been mated with the carrier tape. When the HAA or PSA is sticky and the semiconductor device in the pocket contacts such sticky adhesive, the semiconductor device can stick to the HAA or PSA. The carrier tape 102 sealed to the cover tape 108 by the adhesive is wound onto a reel 110. Labels 112 may be placed on the reel 110 comprising any kind of information, for example customer name, device part number, product date code, and quantity in the reel. Bar codes may be part of the labels.

Figure 2:
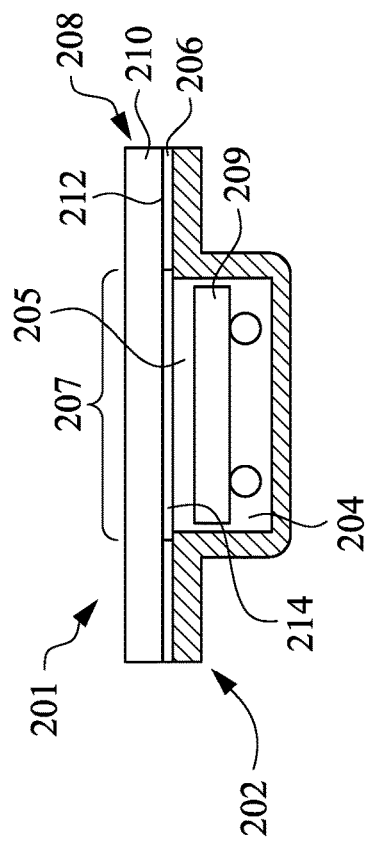
FIG. 2 illustrates a cross-section of the carrier tape system of FIG. 1, along line 2-2.

An embodiment of a carrier tape system 201 in accordance with the present disclosure is illustrated in FIG. 2. FIG. 2 illustrates a cross-section taken along line 2-2 in FIG. 1. Due to the scale of FIG. 1, certain details of carrier tape system 201, including carrier tape 202, cover tape 208 and pockets 204 illustrated in FIG. 2 are not apparent in FIG. 1. Carrier tape system 201 includes cover tape 208 and an underlying carrier tape 202. Carrier tape 202 includes a pocket 204 in which a semiconductor die 209 is located. Pocket 204 includes an opening 205 through which the semiconductor die 209 is passed when the semiconductor die is placed into pocket 204. In the illustrated embodiment, pocket 204 is illustrated as having a square shape; however, pocket 204 can have shapes other than square, for example, other polygon shapes, circular or oval. Carrier tape 208 is formed from plastic materials, such as polycarbonate, polystyrene or polyethylene terephthalate. Carrier tapes in accordance with the present embodiments are not limited to being formed from polycarbonate, polystyrene or polyethylene terephthalate and may be formed from other suitable plastic materials.

In the illustrated embodiment, cover tape 208 includes a layer of cover tape-base material 210 and a layer of cover tape adhesive 206. Cover tape base material 210 is formed from plastic materials, such as polyethylene terephthalate. Cover tapes in accordance with the present embodiments are not limited to being formed from polyethylene terephthalate and may be formed from other suitable plastic materials. In FIG. 2, cover tape base material 210 includes a covering portion 207 positioned over opening 205 and pocket 204. In the embodiment illustrated in FIG. 2, covering portion 207 is located directly over opening 205 and pocket 204. As will be explained in more detail below, the underside of covering portion 207 facing opening 205 and pocket 204 is substantially free of adhesive. As used herein, the phrase "substantially free" as it relates to an amount of adhesive means that there is no adhesive present or that the adhesive present is insufficient to adhere a semiconductor device (contained in a pocket) to a portion of the cover tape that is substantially free of adhesive. In the illustrated embodiment of FIG. 2, a layer of cover tape adhesive 206 is between the underside of cover tape base material 210 and a top side of underlying carrier tape 202. The layer of cover tape adhesive 206 secures portions of carrier tape 202 contacting the layer of cover tape adhesive 206 to portions of cover tape base material 210 contacting the layer of adhesive 206. In accordance with embodiments of the present disclosure, layer of cover tape adhesive 206 does not cover the entire underside of cover tape base material 210, for example, there is substantially no cover tape adhesive 206 on the underside of covering portion 207 of cover tape base material 210.

Figure 3:
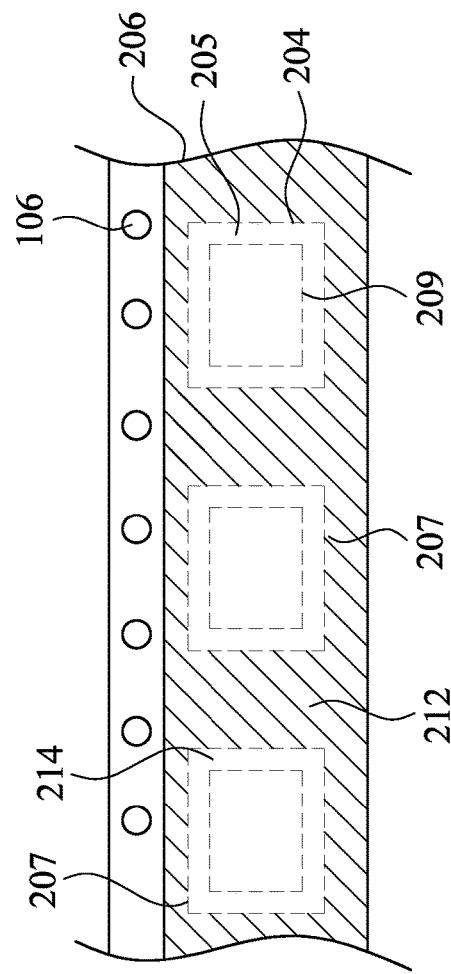
FIG. 3 illustrate a top view of a carrier tape system according to embodiments of the present disclosure.

FIG. 3 illustrates a top view of carrier tape system 201 of FIG. 2. To aid in the understanding of embodiments described herein, in FIG. 3, cover tape-base material 210 is illustrated as being transparent; however, embodiments described herein are not limited to cover tape base material 210 being transparent. Cover tape base material 210 may be translucent or opaque. FIG. 3 illustrates an embodiment wherein pocket 204 and opening 205 of cover tape base material 210 are substantially congruent (e.g., have substantially the same size, for example length and width dimensions, and substantially the same shape, for example square. Pocket 204 and opening 205 are both represented by the same broken line because opening 205 is essentially superimposed over pocket 204. Die 209 within pocket 204 is also depicted in broken lines. In the embodiment of FIG. 3, covering portion 207 of cover tape base material 210 is directly above pocket 204 and opening 205 and is congruent (e.g., has the same size, for example, length and width dimensions) or substantially congruent (e.g., has substantially the same size, for example length and width dimensions, and substantially the same shape, for example square) with pocket 204 and opening 205. In accordance with embodiments described herein, a square shaped covering portion 207 of cover tape base material 210 is substantially congruent with opening 205 when the length dimension of covering portion 207 is within 15% of the length dimension of opening 205 and the width dimension of covering portion 207 is within 15% of the width dimension of opening 205. In accordance with other embodiments described herein, a square shaped covering portion 207 of cover tape base material 210 is substantially congruent with opening 205 when the length dimension of covering portion 207 is within 10% of the length dimension of opening 205 and the width dimension of covering portion 207 is within 10% of the width dimension of opening 205. In accordance with other embodiments described herein, a square shaped covering portion 207 of cover tape base material 210 is substantially congruent with opening 205 when the length dimension of covering portion 207 is within 5% of the length dimension of opening 205 and the width dimension of covering portion 207 is within 5% of the width dimension of opening 205. In embodiments where covering portion 207 has a polygonal shape that is not a square or is oval, the above referenced length and width dimensions refer to the largest dimension in one direction and the dimension in a direction that is perpendicular to the direction of the largest dimension, respectively. In embodiments where covering portion 207 and opening 205 have a circular shape, covering portion 207 is substantially congruent with a round opening 205, when the diameter of the covering portion 207 is within 15% of the diameter of the opening 205. In other embodiments where covering portion 207 and opening 205 have a circular shape, covering portion 207 is substantially congruent with a round opening 205, when the diameter of the covering portion 207 is within 10% of the diameter of the opening 205. In yet other embodiments where covering portion 207 and opening 205 have a circular shape, covering portion 207 is substantially congruent with a round opening 205, when the diameter of the covering portion 207 is within 5% of the diameter of the opening 205.

Figure 4:
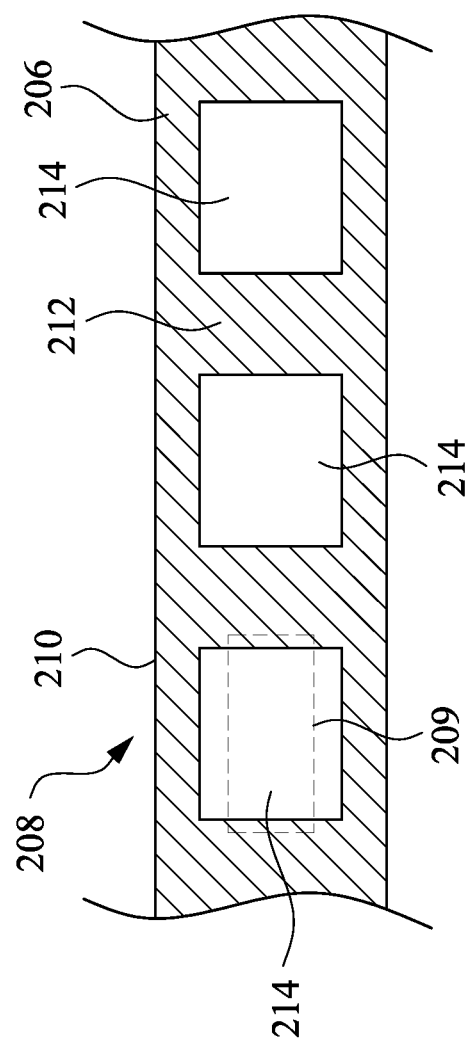
FIGS. 4 and 4A illustrate a bottom view of a cover tape in accordance with embodiments of this disclosure.

In accordance with an embodiment of the present disclosure illustrated in FIGS. 2-4, layer of cover tape adhesive 206 includes an adhesion area 212 represented by the diagonal lining in FIGS. 3 and 4 and three non-adhesion areas 214 in FIGS. 3 and 4. Adhesion area 212 corresponds to portions of the underside of cover tape base material 210 that are in contact with adhesive 206 making up the adhesive layer. Non-adhesion areas 214 correspond to portions of the underside of cover tape base material 210 that are not in contact with the adhesive 206 of the adhesive layer. Stated another way, adhesion area 212 includes portions of the underside of cover tape base material 210 where adhesive 206 is present, and non-adhesion areas 214 include portions of the underside of cover tape base material 210 which are substantially free of adhesive 206. In accordance with embodiments of the present disclosure, non-adhesion areas 214 are located between opening 205 of pocket 204 and covering portion 207 of cover tape base material 210. In accordance with embodiments of the present disclosure, when carrier tape 202 and cover tape 208 are mated with each other, cover tape adhesive 206 in adhesion area 212 secures cover tape base material 210 to carrier tape 202. Non-adhesion areas 214 are positioned directly above openings 205 and directly under covering portion 207.

In accordance with embodiments of the present disclosure, portions of cover tape 208 above opening 205 and pocket 204 where semiconductor device 209 are located are substantially free of adhesive; which results in cover tape systems and cover tapes in accordance with embodiments of the present disclosure providing improved performance with respect to avoiding adhesion between the cover tape and a semiconductor device in a pocket that is covered by the cover tape.

Figure 4A:
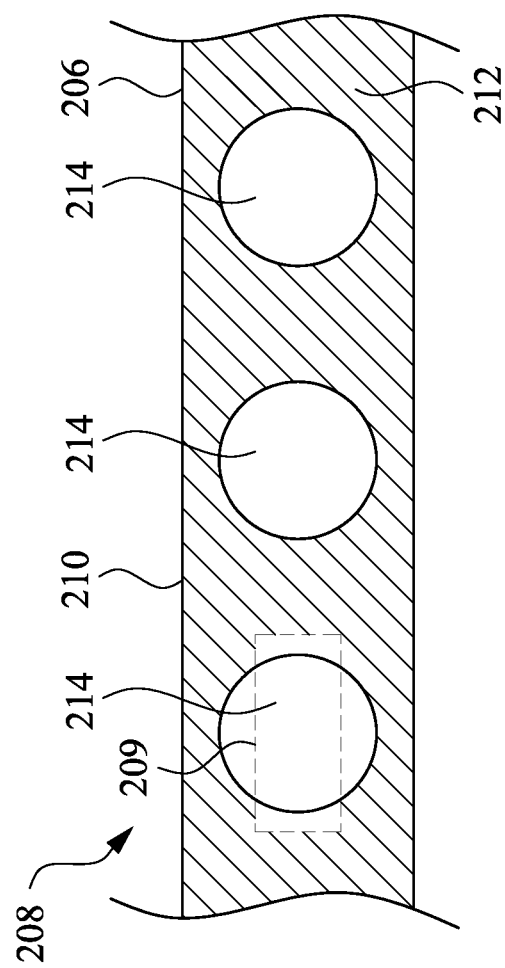

FIG. 4A, illustrates embodiments in accordance with the present disclosure, wherein the non-adhesion areas 214 on the underside of cover tape 208 have a round shape. In the embodiment illustrated in FIG. 4A, for the purpose of illustrating relative dimensions of non-adhesion areas 214 and a die, die 209 is represented by a broken line in relation to the left hand most non-adhesion area 214 in FIG. 4A. In FIG. 4A, the dimensions of die 209 are such that when die 209 is within a pocket of the carrier tape and a cover tape is mated with the carrier tape, a portion of the die is overlapped by non-adhesion area 214 and other portions, e.g., the corners of die 209 are not overlapped by non-adhesion area 214 and are overlapped by adhesion area 212. Another embodiment is illustrated in FIG. 4 shows a die 209 which is wider than the non-adhesion area 214. In FIG. 4, the dimensions of die 209 are such that when die 209 is within a pocket of the carrier tape and a cover tape is mated with the carrier tape, a portion of the die is overlapped by non-adhesion area 214 and other portions, e.g., the corners and left and right hand edges of die 209 are not overlapped by non-adhesion area 214 and are overlapped by adhesion area 212. In the above embodiments illustrated in FIGS. 4 and 4A, the width dimension of the die is illustrated as being greater than the width or diameter of the non-adhesion areas 214. The present embodiments are not limited to width dimensions of the die that are greater than the width or diameter of the non-adhesion area. For example, in other embodiments, another dimension of the die 209, e.g., its length dimension, is greater than the largest dimension of non-adhesion area 214 such that a portion of the die is not overlapped with the non-adhesion area 214.

Figure 5:
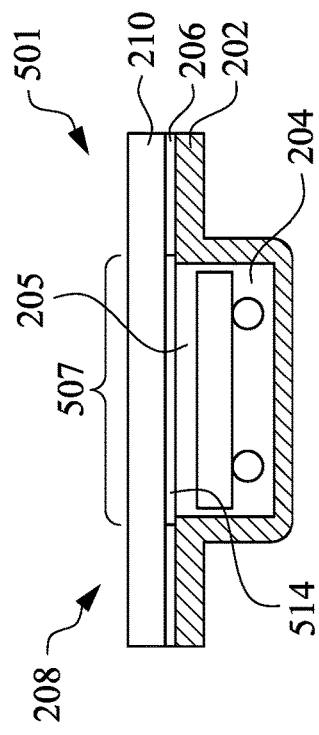
FIG. 5 illustrates a cross-section of a carrier tape system in accordance with another embodiment of the present disclosure.
Figure 6:
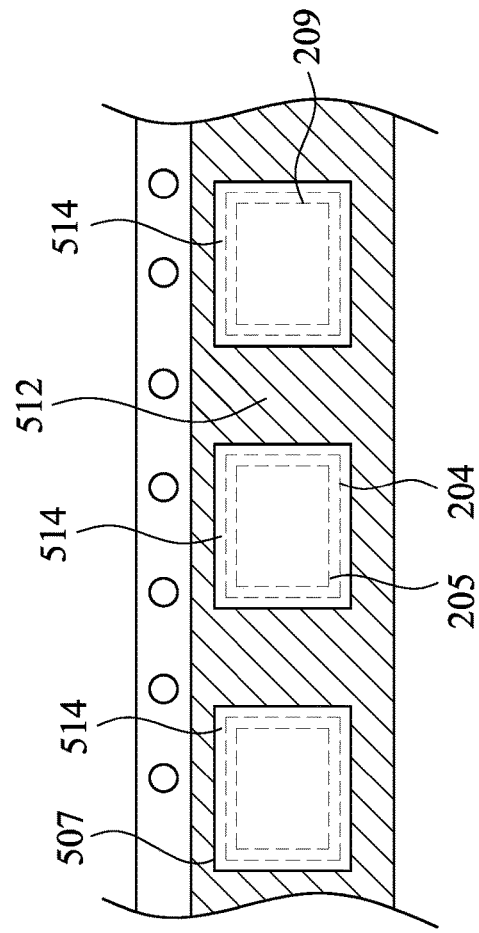
FIG. 6 illustrates a top view of a carrier tape system according to embodiments of the present disclosure.
Figure 7:
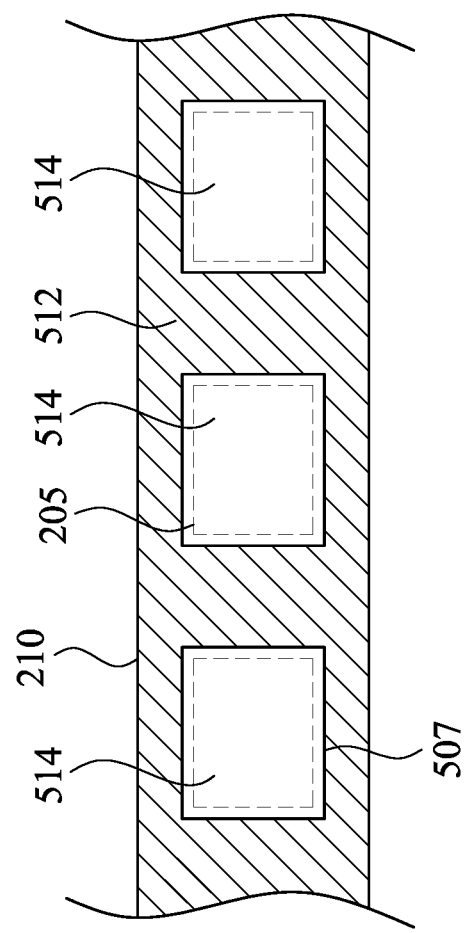
FIG. 7 illustrates a bottom view of a cover tape in accordance with embodiments of this disclosure.

Referring to FIGS. 5-7, another carrier tape system 501 in accordance with the embodiments of the present disclosure is similar to the carrier tape system 201 described above with reference to FIGS. 2-4A; however, the carrier tape system 501 of FIGS. 5-7 include a covering portion 507 of cover tape base material 210 which is directly above pocket 204 and opening 205 that is not substantially congruent (e.g., does not have substantially the same size, for example length and width dimensions) with opening 205. In accordance with embodiments described herein, a square shaped covering portion 507 of cover tape base material 210 is not substantially congruent with opening 205 when the length dimension of covering portion 507 is greater than 15% of the length dimension of opening 205 or the width dimension of covering portion 507 is greater than 15% of the width dimension of opening 205. In accordance with other embodiments described herein, a square shaped covering portion 507 of cover tape base material 210 is not substantially congruent with opening 205 when the length dimension of covering portion 507 is greater than 20% of the length dimension of opening 205 or the width dimension of covering portion 507 is greater than 20% of the width dimension of opening 205. In accordance with other embodiments described herein, a square shaped covering portion 507 of cover tape base material 210 is not substantially congruent with opening 205 when the length dimension of covering portion 507 is greater than 25% of the length dimension of opening 205 or the width dimension of covering portion 507 is greater than 25% of the width dimension of opening 205. In accordance with these embodiments of the present disclosure, covering portion 507 may have a polygonal shape that is not square or is oval. In such embodiments, the above referenced length and width dimensions refer to the largest dimension in one direction and the dimension in a direction that is perpendicular to the direction of the largest dimension, respectively. In embodiments where covering portion 507 and opening 205 have a circular shape, covering portion 507 is not substantially congruent with round opening 205 when the diameter of the covering portion 507 is greater than 15% of the diameter of the opening 205. In other embodiments where covering portion 507 and opening 205 have a circular shape, covering portion 507 is not substantially congruent with round opening 205 when the diameter of the covering portion 507 is greater than 20% of the diameter of the opening 205. In other embodiments where covering portion 507 and opening 205 have a circular shape, covering portion 507 is not substantially congruent with round opening 205 when the diameter of the covering portion 507 is greater than 25% of the diameter of the opening 205.

In accordance with an embodiment of the present disclosure illustrated in FIGS. 5-7, layer of cover tape adhesive 206 includes an adhesion area 512 represented by the diagonal lining in FIGS. 6 and 7 and three non-adhesion areas 514 in FIGS. 6 and 7. Adhesion area 512 includes portions of the underside of cover tape base material 210 that are in contact with adhesive 206 making up the adhesive layer. Non-adhesion areas 514 include portions of the underside of cover tape base material 210 that are not in contact with the adhesive 206 of the adhesive layer. Stated another way, adhesion area 512 includes portions of the underside of cover tape base material 210 where adhesive 206 is present, and non-adhesion areas 514 include portions of the underside of cover tape base material 210 which are substantially free of adhesive 206. In accordance with some embodiments of the present disclosure, non-adhesion areas 514 are located (1) between opening 205 of pocket 204 and covering portion 507 of cover tape base material 210 and (2) portions of carrier tape 202 around opening 205 and covering portion 507 of cover tape base material 210. In accordance with embodiments of the present disclosure, when carrier tape 202 and cover tape 208 are mated with each other, cover tape adhesive 206 in adhesion area 512 secures cover tape base material 210 to carrier tape 202. When carrier tape 202 and cover tape 208 are mated with each other, non-adhesion areas 514 are positioned (1) directly above openings 205 and directly under portions of covering portion 507 and (2) directly over portions of carrier tape 202 around openings 205 and directly under a portion of covering portion 507.

In accordance with embodiments of the present disclosure illustrated in FIGS. 5-7, portions of cover tape 208 above opening 205 and pocket 204 where semiconductor device 209 are located are substantially free of adhesive; which results in cover tape systems and cover tapes in accordance with embodiments of the present disclosure providing improved performance with respect to avoiding adhesion between the cover tape and a semiconductor device in a pocket that is covered by the cover tape.

Embodiments of non-adhesion areas in accordance with the present disclosure are described above as being substantially free of adhesive. In accordance with other embodiments of the present disclosure, the non-adhesion areas include adhesive that has been covered with a material that inhibits or prevents the adhesive from adhering to a device in a pocket in the event the device contacts the non-adhesion area of the cover tape. For example, in FIG. 5, instead of non-adhesion area 514 being substantially free of adhesive, the non-adhesion area 514 includes a material that is not sticky or includes an adhesive wherein the surface of the adhesive adjacent the opening of the pocket has been covered by a material that inhibits or prevents the adhesive from adhering to a device in the pocket. Examples of materials that are applied to an adhesive to inhibit or prevent the adhesive from adhering to a device in the pocket include plastic materials, such as polyethylene terephthalate (a material from which the cover tape base material is formed) or crosslinkable silicone or other coatings that have a low surface energy. The plastic materials can be formed into desired shapes which correspond to the desired shape of the non-adhesion areas and applied to the surface of the adhesive in the non-adhesion area. The crosslinkable silicone or other coatings can be provided on portions of the adhesive layer by printing the materials on the adhesive layer in a desired pattern or patterning techniques.

Figure 8:
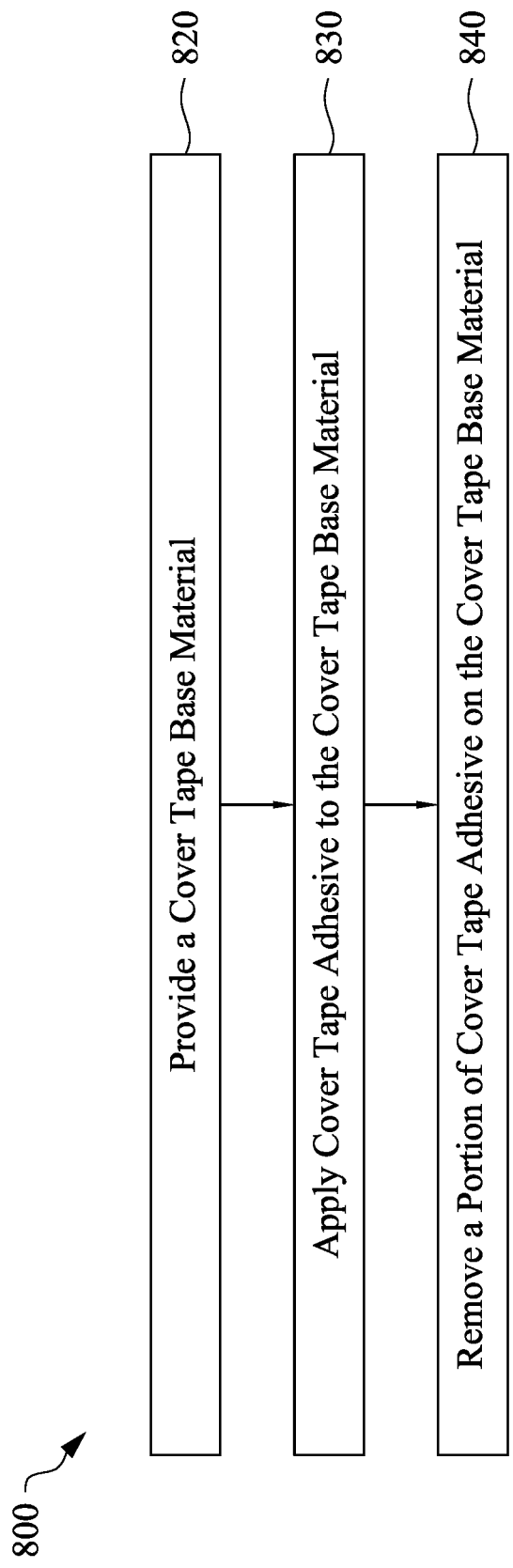
FIG. 8 illustrates an embodiment of methods for making cover tapes in accordance with the present disclosure.

In accordance with embodiments described herein, methods for producing cover tapes in accordance with embodiments described herein include, an operation 800 illustrated in FIG. 8. The illustrated operation 800 includes providing a cover tape base material at step 820. A cover tape adhesive is applied to the cover tape base material at step 830. The cover tape adhesive is applied to the cover tape base material by spraying the cover tape adhesive on the cover tape base material, or using another technique that results in formation of film of adhesive having a uniform thickness on the cover tape base material. Subsequently, a portion of the cover tape adhesive on the cover tape base material is removed (step 840) to define non-adhesion areas on the cover tape base material which are substantially free of adhesive. The portions of the cover tape adhesive on the cover tape base material can be removed by punching through the adhesive layer without punching through the underlying cover tape or using other techniques capable of removing portions of the applied adhesive from the cover tape without damaging the underlying cover tape. Portions of the adhesive layer removed from the cover tape by punching can be recovered and processed so that the recovered adhesive can be applied to another cover tape in subsequent processes.

Figure 9:
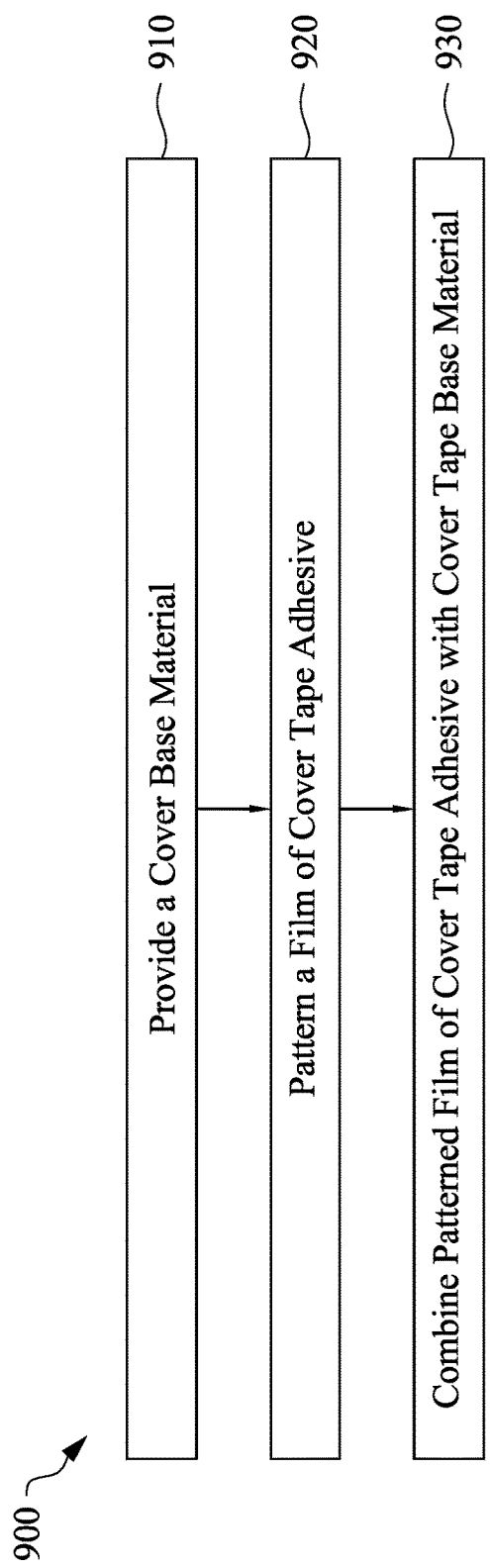
FIG. 9 illustrates another embodiment of methods for making cover tapes in accordance with the present disclosure.

Another embodiment, for producing cover tapes in accordance with the embodiments described herein, includes an operation 900 illustrated in FIG. 9. The illustrated operation 900 includes a step of providing a cover tape base material at step 910. At step 920, a film of cover tape adhesive is patterned, e.g., by punching the film of cover tape adhesive to form the above described adhesion areas and non-adhesion areas or by patterning the adhesive film using another technique capable of forming the adhesion areas and non-adhesion areas described above. The resulting patterned film of cover tape adhesive is combined with a cover tape base material at step 930 to provide a cover tape with the adhesion areas and non-adhesion areas described above. Portions of the cover tape adhesive removed by punching can be recovered and processed so that the recovered adhesive can be used to form another cover tape adhesive film which can be used, to form an additional patterned film of cover tape adhesive.

Figure 10:
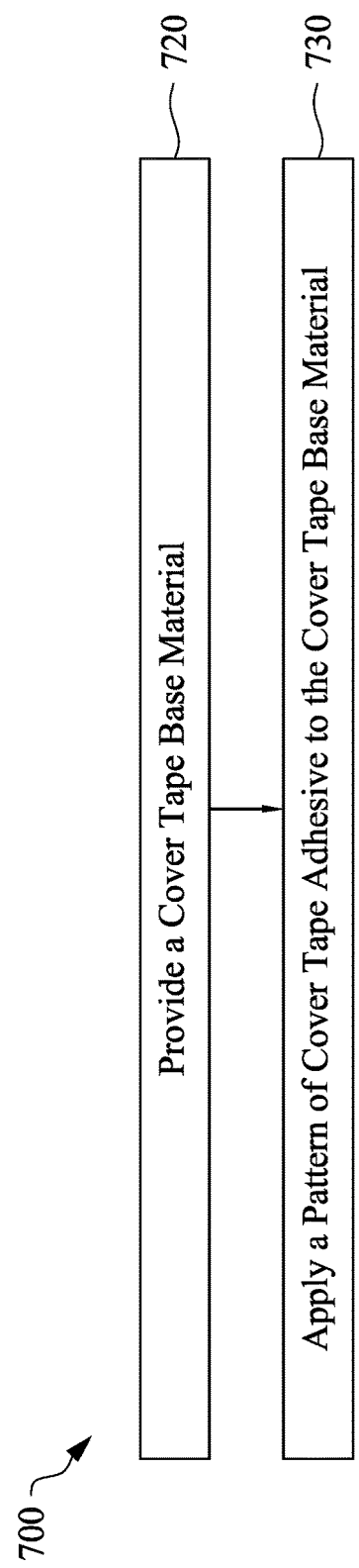
FIG. 10 illustrates another embodiment of methods for making cover tapes in accordance with the present disclosure.

Another embodiment for producing a cover tape in accordance with embodiments described herein, includes, an operation 700 illustrated in FIG. 10. The illustrated operation 700 includes providing a cover tape base material at step 720. At step 730, a pattern of cover tape adhesive is applied to the cover tape base material. The pattern of cover tape adhesive is applied to the cover tape base material by printing the adhesive on the cover tape base material in a pattern to form the adhesion areas and non-adhesion areas described above. Embodiments in accordance with the present disclosure are not limited to printing the adhesive on the cover tape base material. Other techniques capable of applying adhesive to the cover tape in the desired pattern can also be employed.

Figure 12:
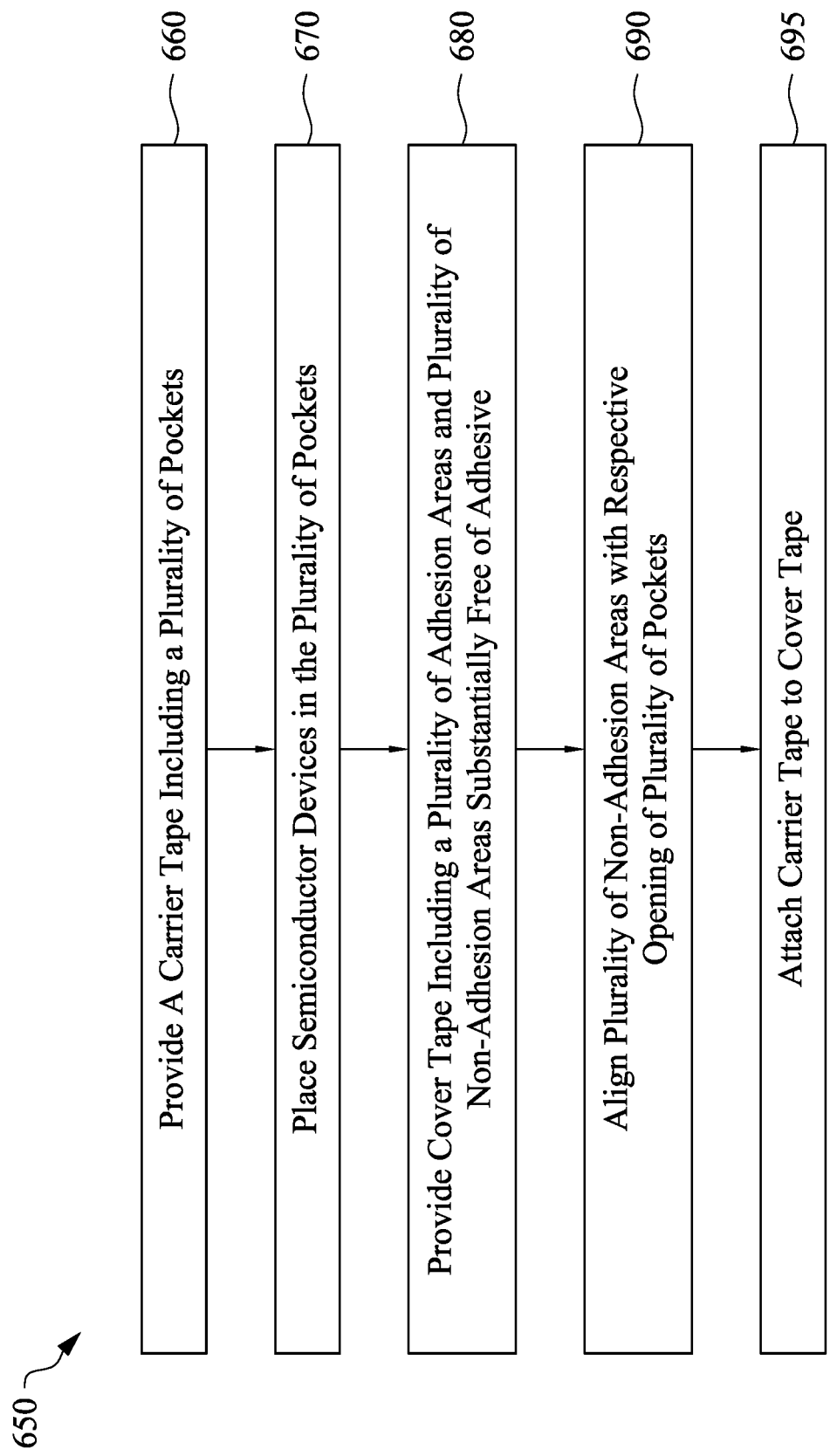
FIG. 12 illustrates an embodiment of forming a semiconductor device carrier system in accordance with the present disclosure.

In embodiments in accordance with the present disclosure also include methods of forming a semiconductor device carrier system, e.g., a tape and reel system. Referring to FIG. 12, one embodiment of such method 650 includes a step 660 of providing a carrier tape, e.g., such as the carrier tapes described above, including a plurality of pockets. At step 670 a semiconductor device is placed in respective ones of the plurality of pockets. A cover tape including a plurality of adhesion areas and a plurality of non-adhesion areas, which are substantially free of adhesive, e.g., a cover tape in accordance with embodiments described above, is provided at step 680. In accordance with method 650, the plurality of non-adhesion areas are aligned with respective openings of the plurality of pockets at step 690. At step 695, the carrier tape is attached to the cover tape. In use, such semiconductor device carrier system is utilized for transporting semiconductor devices. In some embodiments, the semiconductor device carrier system is used in a pick and place device where the semiconductor device is removed from the carrier system and placed in desired locations. In accordance with some embodiments, removing the semiconductor devices from the carrier system includes separating the cover tape from the carrier tape before the semiconductor devices are removed from their respective pockets. Separating the cover tape from the carrier tape includes repeated steps of separating the adhesion areas of the cover tape from the carrier tape and separating the non-adhesion areas of the cover tape from the carrier tape.

Figure 11:
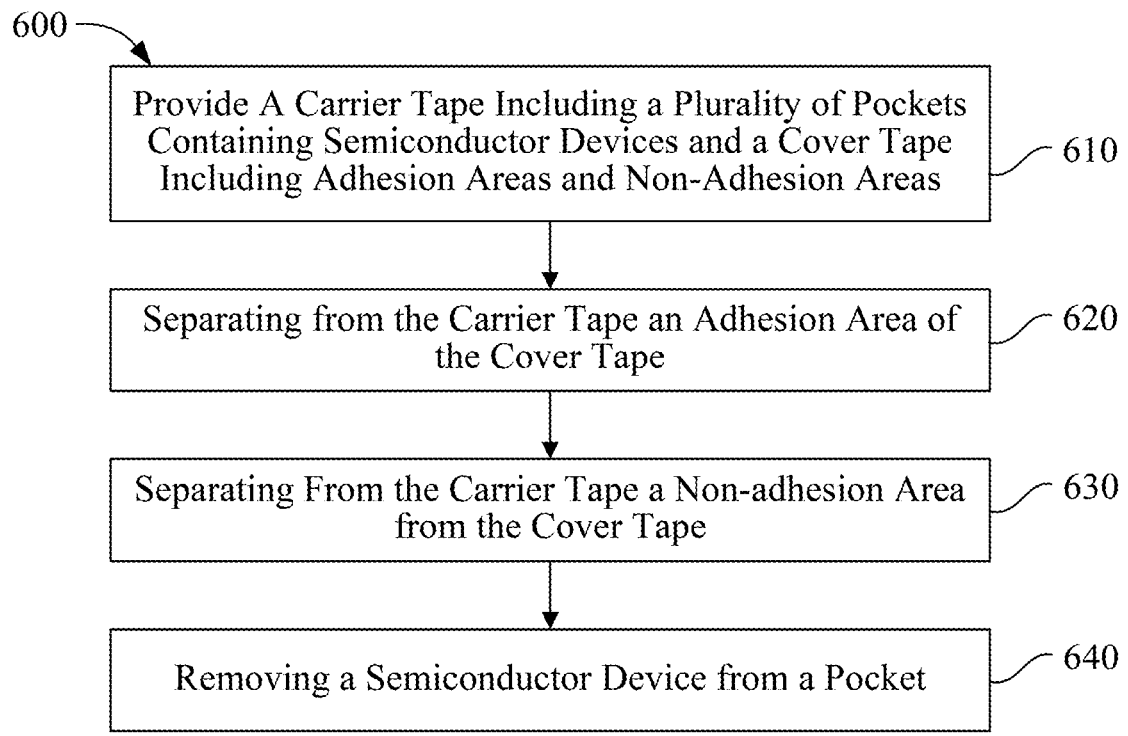
FIG. 11 illustrates an embodiment of supplying semiconductor devices to an apparatus for placing the semiconductor devices at desired locations in accordance with embodiments of the present disclosure.

Embodiments in accordance with the present disclosure include methods for supplying semiconductor devices to an apparatus, which in operation, places the semiconductor devices at desired locations. An embodiment of such method includes operation 600 illustrated in FIG. 11. The illustrated operation 600 includes step 610 of providing a carrier tape system including a carrier tape including a plurality of pockets containing semiconductor devices and a cover tape adhered to the carrier tape, the cover tape including adhesion areas and non-adhesion areas in accordance with embodiments of the present disclosure. At step 620, the adhesion area of the cover tape is separated from the carrier tape. At step 630, a non-adhesion area of the cover tape is separated from the carrier tape. At step 640, the semiconductor device is removed from a pocket and made available for further processing, for example, placement at a desired location. An example of a desired location includes a substrate, e.g., a circuit board or other substrate, to which the semiconductor device will be secured. For example, when the semiconductor device includes conductive bumps, after the semiconductor device is removed from the carrier tape system and transported to a desired location, it is bonded to the substrate by reflowing the material of the conductive bumps. Embodiments of the present disclosure are not limited to bonding semiconductor devices to substrates by reflowing conductive bumps and embodiments of the present disclosure contemplate bonding of semiconductor devices to a substrate using techniques other, such as wire bonding and similar techniques for providing an electrical connection between the semiconductor device and the substrate.

The foregoing outlines features of several embodiments so that those skilled in the art may better understand the aspects of the present description. Those skilled in the art should appreciate that they may readily use the present description as a basis for designing or modifying other processes and structures for carrying out the same purposes and/or achieving the same advantages of the embodiments introduced herein. Those skilled in the art should also realize that such equivalent constructions do not depart from the spirit and scope of the present description, and that they may make various changes, substitutions, and alterations herein without departing from the spirit and scope of the present description.

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The present disclosure may be further appreciated with the description of the following embodiments:

In a carrier tape system embodiment, the carrier tape system includes a carrier tape that includes a pocket for a semiconductor device, wherein the pocket includes an opening through which the semiconductor passes when the semiconductor devices placed in the pocket. The carrier tape system further includes a cover tape including a covering portion directly over the opening of the carrier tape. The carrier tape system includes an adhesive position between the cover tape and portions of the carrier tape around the opening, the covering portion of the cover tape being substantially free of adhesive.

In a cover tape embodiment, a cover tape for use with a semiconductor device carrier tape that includes a pocket having an opening through which a semiconductor device passes when the semiconductor devices placed in the pocket includes a cover tape base material, and an adhesive layer on the cover tape base material. The adhesive layer includes a plurality of adhesion areas including adhesive and a plurality of non-adhesion areas substantially free of adhesive.

Embodiments of a method for supplying semiconductor devices to an apparatus, which in operation, places a semiconductor devices at desired locations includes a step of separating, from a carrier tape that includes a pocket having an opening through which a semiconductor device passes in the semiconductor devices placed in the pocket, and adhesion area of the cover tape, the adhesion area of the cover tape including adhesive. The embodiments further include a step of separating, from the carrier tape, a covering portion of the cover tape which prior to the separation is directly over the opening of the pocket, the covering portion being substantially free of adhesive.

Embodiments of methods of forming a semiconductor device carrier system include providing a carrier tape including a plurality of pockets, each for receiving a semiconductor device. Each pocket includes an opening through which the semiconductor device passes when the semiconductor device is placed in a pocket. After the semiconductor device is placed in pocket, a cover tape including an adhesive layer that includes a plurality of adhesion areas including adhesive and a plurality of non-adhesion areas substantially free of adhesive is aligned with the carrier tape such that the plurality of non-adhesion areas are aligned with respective openings of the plurality of pockets. Thereafter the carrier tape is attached to the cover tape.

Embodiments of a method for supplying semiconductor devices to an apparatus, which in operation, places a semiconductor device at desired locations further includes a step of removing semiconductor devices from the pockets.

The invention claimed is:

1. A carrier tape system for a semiconductor device, the carrier tape system comprising:
   a carrier tape including a plurality of pockets, each pocket including an opening through which a semiconductor device passes when the semiconductor device is placed in the pocket, the semiconductor device having a width dimension; and
   a cover tape including a cover tape base material and an adhesive layer on the cover tape base material, the adhesive layer including a plurality of adhesion areas consisting of adhesive on the cover tape base material and a plurality of discontinuous non-adhesion areas along a length of the cover tape base material, the discontinuous non-adhesion layers including adhesive on the cover tape base material and a material that is not sticky over the adhesive on the cover tape base material, wherein the plurality of adhesion areas encompass respective ones of the plurality of non-adhesion areas and wherein each of the plurality of non-adhesion areas are spaced from each other along the length of the cover tape base material and correspond to a portion of the cover tape that covers an opening of a pocket of the plurality of pockets, each of the plurality of non-adhesion areas facing a respective one of the plurality of pockets and each of the plurality of discontinuous non-adhesion areas has a width dimension or a diameter that is less than the width dimension of the semiconductor device.

2. The carrier tape system of claim 1, wherein the opening has a size and shape and each of the plurality of non-adhesion areas of the cover tape has a shape that is substantially the same as the shape of the opening of the respective pocket.

3. The carrier tape system of claim 1, wherein the opening has a size and shape and each of the plurality of non-adhesion areas has a shape that is substantially the same as the shape of the opening of the respective pocket and a size that is less than the size of the opening of the respective pocket.

4. The carrier tape system of claim 1, wherein the opening has a length and each of the plurality of non-adhesion areas has a length that is less than the length of the opening of the respective pocket.

5. The carrier tape system of claim 1, wherein the opening has a width and each of the plurality of non-adhesion areas has a width that is less than the width of the opening of the respective pocket.

6. The carrier tape system of claim 1, wherein the material that is not sticky is a polyethylene terephthalate or a crosslinkable silicone.

7. A carrier tape system for a semiconductor device, the carrier tape system comprising:
a carrier tape including a plurality of pockets, each pocket including an opening through which a semiconductor device passes when the semiconductor device is placed in the pocket, the semiconductor device having a width dimension; and
a cover tape including a cover tape base material and an adhesive layer on the cover tape base material, the adhesive layer including a plurality of adhesion areas consisting of adhesive on the cover tape base material and a plurality of discontinuous non-adhesion areas along a length of the cover tape base material, the discontinuous non-adhesion areas including adhesive on the cover tape base material and a material overlying the adhesive on the cover tape base material that inhibits an adhesive from adhering to a semiconductor device when it is in the pocket, wherein the plurality of adhesion areas encompass respective ones of the plurality of non-adhesion areas-, are spaced from each other along the length of the cover tape base material and correspond to portions of the cover tape that cover respective openings of the plurality of pockets, each of the plurality of non-adhesion areas facing a respective one of the plurality of pockets and each of the plurality of discontinuous non-adhesion areas has a width dimension or a diameter that is less than the width dimension of the semiconductor device.

8. The carrier tape system of claim 7, wherein the opening has a shape and each of the plurality of non-adhesion areas of the cover tape has a shape that is substantially the same as the shape of the opening of the respective pocket.

9. The carrier tape system of claim 7, wherein the opening has a size and each of the plurality of non-adhesion areas has a size that is smaller than the size of the opening of the respective pocket.

10. The carrier tape system of claim 7, wherein the opening has a length and each of the plurality of non-adhesion areas has a length that is less than the length of the opening of the respective pocket.

11. The carrier tape system of claim 7, wherein the opening has a width and each of the plurality of non-adhesion areas has a width that is less than the width of the opening of the respective pocket.

12. The carrier tape system of claim 7, wherein the material that inhibits an adhesive from adhering to a semiconductor device when it is in the pocket is a polyethylene terephthalate or a crosslinkable silicone.

13. The carrier tape system of claim 7, wherein the material that inhibits an adhesive from adhering to a semiconductor device when it is in the pocket is polyethylene terephthalate.

14. The carrier tape system of claim 7, wherein the semiconductor device has a width dimension and each of the plurality of non-adhesion areas of the cover tape has a width dimension or a diameter that is less than the width dimension of the semiconductor device.

15. A carrier tape system for a semiconductor device, the carrier tape system comprising:
a carrier tape including a plurality of pockets, each pocket including an opening through which a semiconductor device passes when the semiconductor device is placed in the pocket, the semiconductor device having a width dimension and each opening having a round shape and including a diameter dimension; and
a cover tape including a cover tape base material and an adhesive layer on the cover tape base material, the adhesive layer including a plurality of adhesion areas consisting of adhesive on the cover tape base material and a plurality of discontinuous non-adhesion areas along a length of the cover tape base material, the discontinuous non-adhesion areas including either (1) portions of the adhesive layer covered by a material that inhibits the adhesive layer from adhering to a semiconductor device when it is in the pocket or (2) adhesive on the cover tape base material and a material that is not sticky over the adhesive on the cover tape base material, wherein the plurality of adhesion areas encompass respective ones of the plurality of non-adhesion areas and wherein each of the plurality of non-adhesion areas are round, have a diameter dimension that is less than the width dimension of the semiconductor device, are spaced from each other along the length of the cover tape base material and corresponds to portions of the cover tape that cover a respective opening of a pocket of the plurality of pockets, each of the plurality of non-adhesion areas facing a respective one of the plurality of pockets.

16. The carrier tape system of claim 15, wherein the material that inhibits an adhesive from adhering to a semiconductor device when it is in the pocket is a polyethylene terephthalate or a crosslinkable silicone.

17. The carrier tape system of claim 15, wherein the material that inhibits an adhesive from adhering to a semiconductor device when it is in the pocket is polyethylene terephthalate.

18. The carrier tape system of claim 15, wherein corners of the semiconductor die are overlapped by portions of the adhesion areas.

19. The carrier tape system of claim 15, wherein the material that inhibits an adhesive from adhering to a semiconductor device when it is in the pocket is a polyethylene terephthalate or a crosslinkable silicone.

20. The carrier tape system of claim 15, wherein the material that inhibits an adhesive from adhering to a semiconductor device when it is in the pocket is polyethylene terephthalate.

* * * * *